US012486572B2

(12) United States Patent
Cho et al.

(10) Patent No.: US 12,486,572 B2
(45) Date of Patent: Dec. 2, 2025

(54) MECHATRONIC SPATIAL ATOMIC LAYER DEPOSITION SYSTEM WITH CLOSED-LOOP FEEDBACK CONTROL OF PARALLELISM AND COMPONENT ALIGNMENT

(71) Applicant: The Regents of the University of Michigan, Ann Arbor, MI (US)

(72) Inventors: Tae H. Cho, Ann Arbor, MI (US); Ellis Herman, Cambridge, MA (US); Orlando Trejo, Ann Arbor, MI (US); Mattison Rose, Ann Arbor, MI (US); Lauren Ransohoff, Brookline, MA (US); Neil Dasgupta, Ann Arbor, MI (US); Kira Barton, Ann Arbor, MI (US); Hyunwoo Park, San Diego, CA (US); Andre Brooks, Southgate, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 395 days.

(21) Appl. No.: 17/801,972

(22) PCT Filed: Jan. 23, 2021

(86) PCT No.: PCT/US2021/014824
§ 371 (c)(1),
(2) Date: Aug. 24, 2022

(87) PCT Pub. No.: WO2021/173274
PCT Pub. Date: Sep. 2, 2021

(65) Prior Publication Data

US 2023/0097272 A1 Mar. 30, 2023

Related U.S. Application Data

(60) Provisional application No. 62/981,231, filed on Feb. 25, 2020.

(51) Int. Cl.
*C23C 16/455* (2006.01)
*C23C 16/458* (2006.01)
*C23C 16/52* (2006.01)

(52) U.S. Cl.
CPC .. *C23C 16/45551* (2013.01); *C23C 16/45519* (2013.01); *C23C 16/4585* (2013.01); *C23C 16/52* (2013.01)

(58) Field of Classification Search
CPC ................ C23C 16/4585; C23C 16/52; C23C 16/45551
See application file for complete search history.

(56) References Cited

U.S. PATENT DOCUMENTS

2010/0075488 A1* 3/2010 Collins ............ H01L 21/67115 438/584
2010/0112212 A1 5/2010 Zhang et al.
(Continued)

FOREIGN PATENT DOCUMENTS

KR 10-2010-0065616 A 6/2010

OTHER PUBLICATIONS

International Search Report corresponding to International Application No. PCT/US2021/014824, dated May 13, 2021, 3 pages.
(Continued)

*Primary Examiner* — Joseph A Miller, Jr.
(74) *Attorney, Agent, or Firm* — Reising Ethington P.C.

(57) ABSTRACT

A spatial atomic layer deposition apparatus that includes a depositor head having an active surface configured to discharge a flow of a first precursor gas, a flow of a second precursor gas, and a flow of an inert gas that separates the flow of the first precursor gas and the flow of the second precursor gas, a substrate plate that opposes the depositor head and has a support surface for retaining a build substrate, a plurality of gap detection sensors producing an
(Continued)

output signal indicative of a distance between the active surface of the depositor head and the support surface of the substrate plate, and a controller that communicates with the plurality of gap detection sensors. The gap detection sensors permit a spatial orientation of the active surface of the depositor head and the support surface of the substrate plate to be determined in real-time and monitored.

19 Claims, 4 Drawing Sheets

(56) References Cited

U.S. PATENT DOCUMENTS

| | | | | |
|---|---|---|---|---|
| 2011/0220022 | A1* | 9/2011 | Hong | C23C 14/568 118/663 |
| 2015/0376782 | A1* | 12/2015 | Griffin | G01D 5/24 118/712 |
| 2015/0376786 | A1* | 12/2015 | Yudovsky | C23C 16/455 118/730 |
| 2017/0362707 | A1 | 12/2017 | Zijlmans et al. | |
| 2019/0153601 | A1* | 5/2019 | Luo | C23C 16/50 |
| 2020/0181776 | A1* | 6/2020 | Wiltse | C23C 16/45589 |
| 2020/0217657 | A1* | 7/2020 | Emerson | C23C 16/52 |

OTHER PUBLICATIONS

Written Opinion corresponding to International Application No. PCT/US2021/014824, dated May 13, 2021, 6 pages.

Khoo et al. "Heated Motorized Stage for Nanoscale Thin Film Deposition", Materials Science, 2015. Retrieved from the internet: <URL: https://www.semanticscholar.org/paper/Heated-Motorized-Stage-for-Nanoscale-Thin-Film-Khoo-Park/0f24983baa40c1b588d4b7ab2ae0b54485b3aea0#related-papers>. X p. 4, line 27-p. 27, line 4; tables C.1, D.4; and figures B.2-A.E.1.

Waldman et al., "Companion diagnostics at the intersection of personalized medicine and heatlhcare delivery", Biomarkers in Medicine, 2015, 9(1), pp. 1-3.

"Continuous glucose monitoring", Medtronic, https://www.medtronicdiabetes.com/treatments/continuous-glucose-monitoring, accessed Mar. 31, 2024.

Verily Projects, https://web.archive.org/web/20170202091409/https://verily.com/projects/, accessed Mar. 31, 2024.

Nelson et al., "Improviing Yield and Performance in ZnO Thin-Film Transistors Made Using Selective Area Deposition", Applied Materials & Interfaces, 2015, 7, pp. 2754-2759.

Bai et al., "Fabrication of sub-20 nm nanopore arrays in membranes with embedded metal electrodes at wafer scales", Nanoscale, May 7, 2014, pp. 8900-8906.

Dasgupta et al., "Atomic Layer Deposition of Platinum Catalysts on Nanowire Surfaces for Photoelectrochemical Water Reduction", Journal of the American Chemical Society, Aug. 20, 2013, pp. 12932-12935.

Poodt et al., "Spatial atomic layer deposition: a route towards further industrialization of atomic layer deposition", Journal of Vacuum Science and Technology A, 30(1), Jan. 1, 2012, pp. 010802-1-010802-11.

Musselman et al., "Nanomanufacturing: High-Throughout, Cost-Effective Deposition of Atomic Scale Thin Films via Atmospheric Pressure Spatial Atomic Layer Deposition", Chemistry of Materials, Nov. 11, 2016, pp. 8443-8452.

Barton et al., "Control of high-resolution electrohydrodynamic jet printing", Control Engineering Practice 19, 2011, pp. 1266-1273.

Pannier et al., "An electrohydrodynamic jet printer with integrated metrology", Mechatronics 56, 2018, pp. 268-276.

"Improving Yield and Performance in ZnO Thin-Film Transistors Made Using Selective Area Deposition" by Shelby F. Nelson et al., published Jan. 6, 2015, 6 pages.

"Fabrication of sub-20 nm nanopore arrays in membranes with embedded metal electrodes at wafer scales" by Jingwei Bai et al., published Apr. 30, 2014, 7 pages.

"Atomic Layer Deposition of Platinum Catalysts on Nanowire Surfaces for Photoelectrochemical Water Reduction" by Neil P. Dasgupta et al., published Aug. 20, 2013, 4 pages.

"Spatial atomic layer deposition: A route towards further industrialization of atomic layer deposition" by Paul Poodt et al., published Dec. 14, 2011, 12 pages.

"Nanomanufacturing: High-Throughput, Cost-Effective Deposition of Atomic Scale Thin Films via Atmospheric Pressure Spatial Atomic Layer Deposition" by Kevin Musselman et al., published Nov. 11, 2016, 10 pages.

"Control of high-resolution electrohydrodynamic jet printing" by Kira Barton et al., published Aug. 10, 2011, 8 pages.

"An electrohydrodynamic jet printer with integrated metrology" by Christopher Pannier et al., published Aug. 14, 2018, 9 pages.

* cited by examiner

MECHATRONIC SPATIAL ATOMIC LAYER DEPOSITION SYSTEM WITH CLOSED-LOOP FEEDBACK CONTROL OF PARALLELISM AND COMPONENT ALIGNMENT

STATEMENT REGARDING FEDERALLY SPONSORED RESEARCH OR DEVELOPMENT

This invention was made with government support under CMMI1727918 awarded by the National Science Foundation. The government has certain rights in the invention.

TECHNICAL FIELD

The present disclosure relates generally to spatial atomic layer deposition and, more specifically, to monitoring and, if necessary, adjusting the relative positioning of the depositor head and the opposed substrate plate during operation of the spatial atomic layer deposition apparatus.

BACKGROUND

Atomic layer deposition (ALD) is a thin-film deposition technique that is capable of conformally coating a substrate—typically an ultra-high-aspect ratio substrate—with an angstrom-scale film of an ALD material one atomic layer at a time. ALD involves sequentially exposing a designated portion of a build substrate to first and second ALD precursor gases. Each of the ALD precursor gases includes reactive ligands that participate in a self-limiting surface reaction to chemically deposit an atomic monolayer of the reacted precursor gases. The two atomic monolayers that are derived alternately from the ALD precursor gases together produce a single atomic layer of the ALD material film upon completion of their reaction. As such, the thickness of the ALD material film can be controlled by varying the number of ALD cycles performed and, thus, the number of atomic layers of the ALD material that are chemically-deposited in a layer-by-layer fashion. Indeed, the ALD material film exhibits a linear growth rate; that is, the thickness of the film is proportional to the number of ALD cycles performed. The material that can be deposited by ALD can range from oxides to nitrides, sulfides, carbides, and/or metals by exploiting the self-limiting binary chemical reactions of ALD.

Spatial atomic layer deposition (SALD) is a specific version of ALD where the ALD cycles are spatially controlled by exposing the build substrate to different precursor gas zones rather than a conventional temporally controlled ALD process where long purging of the precursor gases in a static chamber is required. In SALD, the time-consuming purge step of conventional ALD is not practiced, which expedites the process by about three orders of magnitude, without sacrificing the self-limiting, conformal growth of the ALD material film. As a result, the net deposition rate of SALD is much greater compared to conventional ALD, which enables higher throughput in a shorter amount of time. SALD deposition processes may be performed in conjunction with the prior patterning of inhibition materials by printing, stamping, lithography, or other patterning methods, in a process known as area-selective atomic layer deposition (AS-ALD). AS-ALD can be used to fabricate 3-D devices in a bottom-up manner without the need for lithography and top-down etching processes. The thin-film 3-D devices may even include multiple films of dissimilar materials to stack thin film layers for device fabrication.

An SALD apparatus that performs the SALD process includes a depositor head that discharges at least one flow of each of the ALD precursor gases. The flows of the ALD precursor gases are separated by a flow of an inert gas. The gas flows discharged from the depositor head may extend linearly and parallel to one another to establish an elongated zone of each of the ALD precursor gases and an elongated inert gas curtain that isolates the ALD precursor gas zones for at least a certain distance away from the depositor head. In addition to the depositor head, the SALD apparatus also includes a substrate plate that opposes the depositor head and retains the build substrate onto which the ALD material film is grown. SALD can be performed at atmospheric pressure since the reactive ALD precursor gases are confined spatially by the inert gas zones.

The substrate plate is oriented spatially with respect to the depositor head to facilitate the SALD process. In particular, the substrate plate and the depositor head are spaced apart by a gap, which is preferably maintained as uniform as possible in an effort to achieve parallelism between the depositor head and the substrate plate. The gap is typically relatively small—on the order of several tens to several hundreds of microns—to ensure isolation of the precursor gas zones. If the gap is or becomes too large, the inert gas curtain(s) will begin to dissipate prior to reaching the build substrate that is held on the substrate plate, which may allow the ALD precursor gases to diffuse through the inert gas curtains and mix together. Such unintended mixing of the ALD precursor gases is detrimental to the SALD process since it results in chemical vapor deposition (CVD) growth instead of the controlled layer-by-layer growth of the ALD film material. Furthermore, the ALD precursor gases may escape to the surrounding environment and may even react with air if the gap between the depositor head and the substrate plate becomes too large.

The depositor head and the substrate plate have conventionally been positioned relative to one another using manual adjustment techniques. The two components are set at the desired spacing as close-to-parallel as feasible, and the SALD apparatus is operated with the expectation that the depositor head and the substrate plate will not stray from their original set positions. The positional relationship between the depositor head and the substrate plate, including, most notably, the size and uniformity of the gap between the opposed surfaces of those two components, is generally not monitored with instrumentation installed on the SALD apparatus. In the present application, an approach for monitoring the spatial orientation of the depositor head and the substrate plate in real-time during operation of the SALD apparatus is disclosed. The disclosed approach permits the size of the gap between the depositor head and the substrate plate and/or the parallelism of the two components to be monitored over time and, if necessary, adjusted to correct for any deviation in the relative positioning of the two components that may have occurred.

SUMMARY

According to one aspect of the disclosure, there is provided a spatial atomic layer deposition apparatus that includes:

a depositor head having an active surface configured to discharge a flow of a first precursor gas, a flow of a second precursor gas, and a flow of an inert gas that separates the flow of the first precursor gas and the flow of the second precursor gas;

a substrate plate that opposes the depositor head, the substrate plate having a support surface that retains a build substrate, the support surface of the substrate plate being spaced apart from the active surface of the depositor head by a gap;

a plurality of gap detection sensors supported on either the depositor head or the substrate plate, each of the gap detection sensors producing an output signal indicative of a distance between the active surface of the depositor head and the support surface of the substrate plate; and a controller that communicates with the plurality of gap detection sensors and receives the output signal from each of the plurality of gap detection sensors, the controller, based on the output signals received from the gap detection sensors, being configured to determine a spatial orientation of the active surface of the depositor head and the support surface of the substrate plate.

According to various embodiments, the spatial atomic layer deposition apparatus may further include any one of the following features or any technically-feasible combination of some or all of these features:

- the spatial orientation of the active surface of the depositor head and the support surface of the substrate plate is at least one of (i) a size of the gap between the active surface of the depositor head and the support surface of the substrate plate or (ii) whether the active surface of the depositor head and the support surface of the substrate plate are parallel to one another;
- a plurality of linear actuators supporting the substrate plate, the plurality of linear actuators being configured to move the substrate plate to adjust the spatial orientation of the active surface of the depositor head and the support surface of the substrate plate;
- each of the plurality of linear actuators comprises a motor and an actuation rod connected to and driven by the motor, the motor of each of the plurality of linear actuators being configured to drive linear displacement of its associated actuation rod;
- the controller communicates with the motor of each of the plurality of linear actuators and is configured to send a positioning signal to each of the plurality of linear actuators that commands the motor of the linear actuator to linearly displace its associated actuation rod;
- the controller is configured to send the positioning signal to each of the plurality of motors to instruct the motor to actuate its corresponding actuation rod a defined distance to move the substrate plate and adjust the spatial orientation of the active surface of the depositor head and the support surface of the substrate plate;
- a bridge supported in an elevated position above the substrate plate and having an elongated body that is tiltable about both a longitudinal axis and a lateral axis of the body, and an ALD precursor gas distributor that is carried on the elongated bridge, the ALD precursor gas distributor comprising the depositor head and a gas manifold that supplies the depositor head with the flow of a first precursor gas, the flow of a second precursor gas, and the flow of an inert gas;
- a linear motion stage that reciprocally moves the substrate plate relative to the depositor head;
- each of the plurality of gap detection sensors is a capacitive sensor.

According to another aspect of the disclosure, there is provided a spatial atomic layer deposition apparatus that includes:

a bridge supported in an elevated position and having an elongated body that is tiltable about both a longitudinal axis and a lateral axis of the body;

an ALD precursor gas distributor carried by the elongated body, the ALD precursor gas distributor comprising a depositor head having an active surface configured to discharge a flow of a first precursor gas, a flow of a second precursor gas, and a flow of an inert gas that separates the flow of the first precursor gas and the flow of the second precursor gas;

a substrate plate that opposes the depositor head, the substrate plate having a support surface that retains a build substrate and a back surface opposite the support surface, the support surface of the substrate plate being spaced apart from the active surface of the depositor head by a gap;

a plurality of linear actuators that engage the back surface of the substrate plate;

a plurality of gap detection sensors supported on either the depositor head or the substrate plate, each of the gap detection sensors producing an output signal indicative of a distance between the active surface of the depositor head and the support surface of the substrate plate at a location of the sensor; and a controller that receives the output signal from each of the plurality of gap detection sensors and sends a positioning signal to each of the plurality of linear actuators, the controller being configured to determine a spatial orientation of the active surface of the depositor head and the support surface of the substrate plate based on the output signals received from the gap detection sensors and to adjust the size or the uniformity of the gap between the support surface of the substrate plate and the active surface of the depositor head by actuating, via the positioning signals, one or more of the plurality of linear actuators.

According to various embodiments, the spatial atomic layer deposition apparatus may further include any one of the following features or any technically-feasible combination of some or all of these features:

- each of the plurality of linear actuators comprises a motor and an actuation rod connected to and driven by the motor, the motor of each of the plurality of linear actuators being configured to drive linear displacement of its associated actuation rod;
- the controller is configured to send the positioning signal to each of the plurality of linear actuators to command the motor of the linear actuator to linearly displace its associated actuation rod a defined distance to move the substrate plate and adjust the size or the uniformity of the gap between the support surface of the substrate plate and the active surface of the depositor head;
- each of the plurality of gap detection sensors is a capacitive sensor;
- a linear motion stage that reciprocally moves the substrate plate relative to the depositor head.

According to another aspect of the disclosure, there is provided method of operating a spatial atomic layer deposition apparatus that includes the steps of:

supplying a first ALD precursor gas, a second ALD precursor gas, and an inert gas to a depositor head of a spatial atomic layer deposition apparatus;

discharging at least one linear flow of the first ALD precursor gas, at least one linear flow of the second ALD precursor gas, and at least one linear flow of the inert gas from an active surface of the depositor head, the at least one linear flow of the inert gas separating the at least one linear flow of the first ALD precursor gas and the at least one linear flow of the second ALD precursor gas;

moving a substrate plate that retains a build substrate on a support surface relative to the depositor head to deposit one or more atomic layers of an ALD material film, each atomic layer of the ALD material film being deposited by sequentially exposing the build substrate to the linear flow of the first ALD precursor gas and the linear flow of the second ALD precursor gas as a result of relative movement between the substrate plate and the depositor head, wherein the first and the second ALD precursor gases react to form the atomic layers of the ALD material film; and measuring a spatial orientation of the active surface of the depositor head and the support surface of the substrate plate using a plurality of gap detection sensors mounted to either the depositor head or the substrate plate, each of the plurality of gap detection sensors producing an output signal indicative of a distance it measures between the active surface of the depositor head and the support surface of the substrate plate.

According to various embodiments, the method of operating a spatial atomic layer deposition apparatus may further include any one of the following features or steps or any technically-feasible combination of some or all of these features/steps:

- receiving the output signals generated by the plurality of gap detection sensors at a controller, and determining whether the active surface of the depositor head and the support surface of the substrate plate are parallel to each other based on the output signals received by the controller from the plurality of gap detection sensors;
- sending positioning signals from the controller to a plurality of linear actuators that support and are in engagement with the substrate plate, the positioning signals commanding the plurality of liner actuators to move the substrate plate and adjust the spatial orientation of the active surface of the depositor head and the support surface of the substrate plate;
- receiving the output signals generated by the plurality of gap detection sensors at a controller, and adjusting the spatial orientation of the active surface of the depositor head and the support surface of the substrate plate by tilting the depositor head, tilting the substrate plate, or tilting both the depositor head and the substrate plate, the tilting of the depositor head, the substrate plate, or both the depositor head and the substrate plate being commanded by the controller;
- the adjusting the spatial orientation of the active surface of the depositor head and the support surface of the substrate plate comprises achieving parallelism between the active surface of the depositor head and the support surface of the substrate plate;
- the adjusting the spatial orientation of the active surface of the depositor head and the support surface of the substrate plate comprises adjusting a size of a gap between the active surface of the depositor head and the support surface of the substrate plate.

BRIEF DESCRIPTION OF THE DRAWINGS

Example embodiments will hereinafter be described in conjunction with the appended drawings, wherein like designations denote like elements, and wherein.

DETAILED DESCRIPTION

The present disclosure describes an SALD apparatus that includes a depositor head that discharges linear zone-separated first and second ALD precursor gases towards an opposed substrate plate that retains a build substrate where SALD growth is directed. An active surface of the depositor head through which the first and second ALD precursor gases are discharged and a confronting support surface of the substrate plate are separated by a gap. The size of the gap is maintained at a target value, typically in the range of 50 μm to 1000 μm, with a spatial tolerance of no more than 10 μm, to ensure that adjacent ALD precursor gas zones remain separated by an intervening inert gas curtain. Any deviation in the size and/or the uniformity of the gap that may occur through unwanted variations in the relative spatial orientation of the depositor head and the substrate plate can heighten the possibility that the inert gas curtain(s) will be unable to fully isolate the ALD precursor gas zones. If the ALD precursor gas zones lose their fluid autonomy and begin to intermix, the layer-by-layer growth mechanism of SALD will wane and give way to CVD deposition instead. Furthermore, this may result in the leakage of ALD precursor gases to the atmosphere. To that end, the disclosed SALD apparatus and, in particular, one of the depositor head or the substrate plate, is outfitted with gap detection sensors. These gap detection sensors communicate with a controller and render the SALD apparatus capable of real-time adjustment of the gap between the active and support surfaces of the depositor head and the substrate plate, respectively, as well as dynamic gap alignment control.

The first and second ALD precursor gases used during SALD processing may vary depending on the composition of the ALD material film being deposited. The first ALD precursor gas may, for example, be an organometallic gas, and the second ALD precursor gas may be an oxidant gas. In one implementation of SALD, the ALD material film grown on the build substrate may be a metal oxide such as zinc oxide (ZnO), tin oxide ($SnO_2$), or aluminum oxide ($Al_2O_3$). To deposit ZnO, $SnO_2$, or $Al_2O_3$ by SALD, the first ALD precursor gas (an organometallic gas) may be diethylzinc (DEZ) for ZnO, tetrakis(dimethylamido)tin (TDMASn) for $SnO_2$, and dimethylaluminum isopropoxide (DMAI) or trimethyl aluminum (TMA) for $Al_2O_3$, and the second ALD precursor gas (an oxidant gas) in each instance may be distilled water. The inert gas used to separate and isolate the first and second ALD precursor gases may be nitrogen ($N_2$). Of course, other ALD precursor gases and inert gases may be employed to form any of the aforementioned metal oxide films as well as other compositions of the ALD material. The SALD apparatus described herein and the ways in which the SALD apparatus is used are not limited to any particular ALD precursor gases, inert gases, or compositions of the deposited ALD material film.

Figure 5:
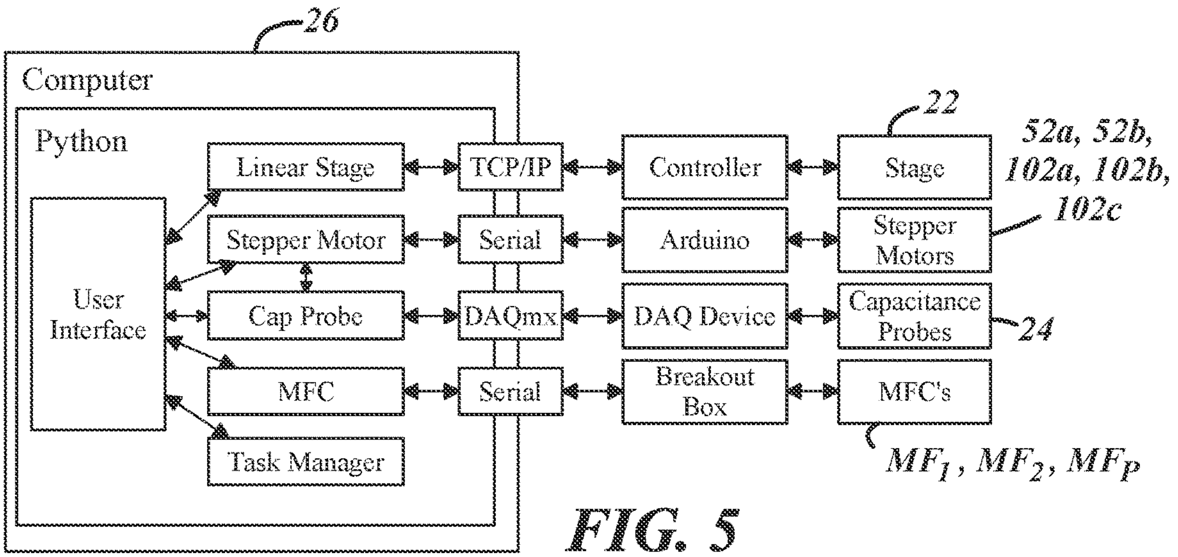
FIG. 5 is diagrammatic representation of a controller of the SALD apparatus depicted in FIG. 1 according to one embodiment of the present disclosure.

Referring now to FIGS. 1-9, a specific embodiment of an SALD apparatus that includes various aspects of the present disclosure is shown. The SALD apparatus is identified by reference numeral 10 and includes a frame 12, a bridge 14, a zoned ALD precursor gas distributor 16, a substrate plate 18, a base plate 20, a linear motion stage 22, gap detection sensors 24, and a controller 26 (FIG. 5). The SALD apparatus 10 is capable of conformally coating at least a growth portion 28 of a build substrate 30 (FIG. 2)—the build substrate 30 being a silicon wafer or a substrate composed of some other inorganic or organic material—with an ultra-high aspect ratio sub-nanometer precision film of an ALD material one atomic layer at a time. The SALD apparatus 10 operates, in general, by sequentially exposing the growth portion 28 of the build substrate 30 to separate zones of the first and second ALD precursor gases so that space-sequenced and self-limiting surface reactions can proceed as the growth portion 28 moves back-and-forth through the spatially-isolated ALD precursor gas zones. A wide variety of products can be manufactured wholly or partially with SALD including, for example, photovoltaic and printed electronic devices.

Figure 3:
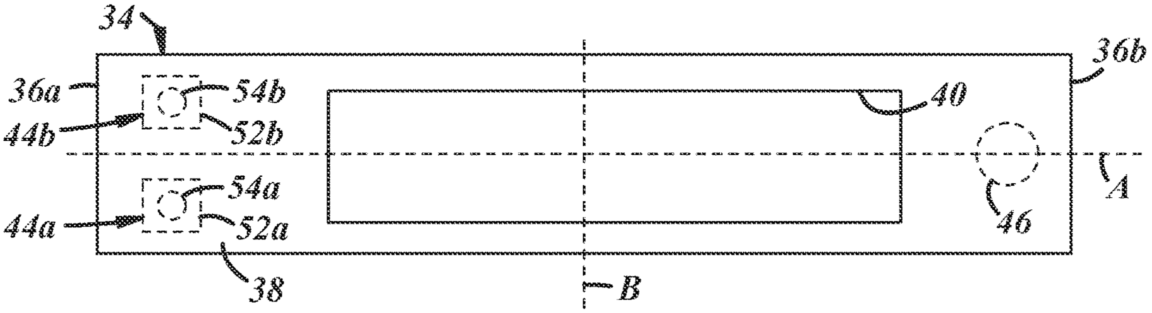
FIG. 3 is plan view of an elongated plate, which serves as the elongated body of the bridge, of the SALD apparatus depicted in FIG. 1 according to one embodiment of the present disclosure.
Figure 4:
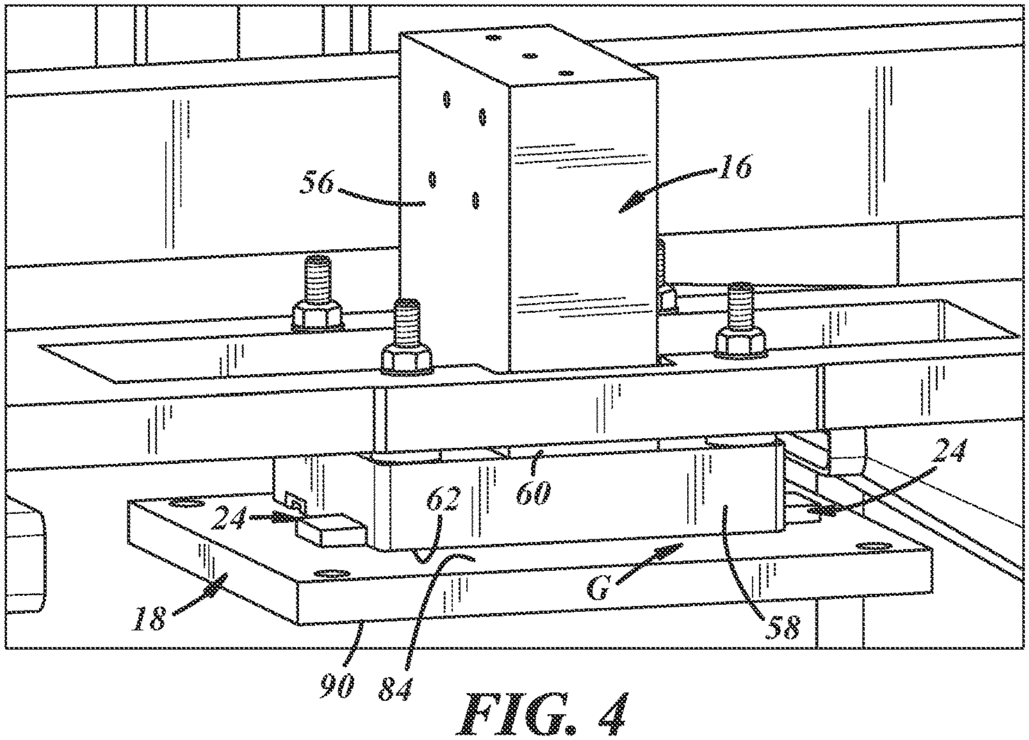
FIG. 4 is magnified perspective view of a depositor head and an opposed substrate plate of the SALD apparatus depicted in FIG. 1 according to one embodiment of the present disclosure.

The frame 12 includes first and second upstanding support legs 32*a*, 32*b* that are spaced apart from one another above a stand surface. The first and second upstanding support legs 32*a*, 32*b* support the bridge 14 horizontally in an elevated position. The bridge 14 comprises an elongated body 34 having opposed first and second ends 36*a*, 36*b*. A longitudinal axis A of the elongated body 34 runs centrally through the body 34 between the opposed first and second ends 36*a*, 36*b* of the body 34 while a lateral axis B runs centrally through the elongated body 34 perpendicular to the longitudinal axis A and half way between the opposed first and second ends 36*a*, 36*b* (FIG. 3). The longitudinal and lateral axes A, B of the elongated body 34 establish a plane that lies parallel to the horizontal—the horizontal being a plane that is level with respect to gravity—within an acceptable tolerance in that each axis A, B may deviate from the horizontal by no more than 5°. A length of the elongated body 34 is measured along the longitudinal axis A and a width of the body 34 is measured along the lateral axis B.

The elongated body 34 carries the zoned ALD precursor gas distributor 16 and is supported in its elevated position on the upstanding support legs 32*a*, 32*b*. The elongated body 34 is tiltable and, as such, has the potential to control the tilt of the gas distributor 16. The elongated body 34 is tiltable in that the plane of the body 34 established by the longitudinal and lateral axes A, B can be tilted about both axes A, B. For example, in the embodiment shown here, the elongated body 34 is an elongated plate 38 that defines a central opening 40. An underside 42 of the plate 38 is supported inboard of the first end 36*a* by first and second linear actuators 44*a*, 44*b* and is also supported inboard of the second end 36*b* by a ball mount 46. The first and second linear actuators 44*a*, 44*b* are secured to an elevated platform 48 of the first upstanding support leg 32*a*, which extends inwardly towards the second upstanding support leg 32*b*. The ball mount 46 that supports the underside 42 of the elongated plate 38 is similarly secured on an elevated platform 50 of the second upstanding support leg 32*b*, which extends inwardly towards the first upstanding support leg 32*a*.

The first and second linear actuators 44*a*, 44*b* preferably include first and second motors 52*a*, 52*b* and first and second actuation rods 54*a*, 54*b* that are connected to and driven by their respective motors 52*a*, 52*b*. The actuation rods 54*a*, 54*b* are linearly displaceable in both a positive (forward or extending) and negative (rearward or retracting) direction. The actuation rod 54*a*, 54*b* of each linear actuator 44*a*, 44*b* is linearly displaceable by a rotatable leadscrew driven by its respective motor 52*a*, 52*b*, which, for example, is preferably a stepper motor. Each of the motors 52*a*, 52*b* used to drive linear displacement of its respective actuation rod 54*a*, 54*b* preferably has a step size or resolution of 1.5 μm or higher to enable precision guided linear displacement of the actuation rods 54*a*, 54*b*. Commercially available actuator assemblies that include a motor and an actuation rod may be employed to support the elongated body 34. For example, one such suitable assembly that may be used here is a linear motion stepper motor assembly from Haydon Kerk Pittman. While stepper motors and actuation rods are described here as being preferred implementations, it will be appreciated that other types of linear actuators and driving mechanisms may of course be employed to achieve the same functionality.

The first and second linear actuators 44*a*, 44*b* support the elongated plate 38 closer to the first end 36*a* than the lateral axis B of the plate 38 and, likewise, the ball mount 46 supports the plate 38 closer to the second end 36*b* than the lateral axis B of the plate 38. The linear actuators 44*a*, 44*b* are spaced apart along the width of the elongated plate 38 with the first actuator 44*a* engaging the underside 42 of the plate 38 on one side of the longitudinal axis A and the second actuator 44*b* engaging the underside 42 of the elongated plate 38 on the other side of the longitudinal axis B. The ball mount 46 engages the underside 42 of the elongated plate 38 on the longitudinal axis A of the plate 38 and, thus, the points of engagement between the underside 42 of the elongated plate 38 and the linear actuators 44*a*, 44*b* and the ball mount 46 form an acute triangle. To that end, the controlled linear displacement of the actuation rods 54*a*, 54*b* of the first and second linear actuators 44*a*, 44*b*—individually and in coordination with each other—plus the articulating movement permitted by the ball mount 46 allows the elongated body 36, which, here is the elongated plate 38, to be tilted about each of its axes A, B to achieve precision movement in three-dimensions.

Figure 1:
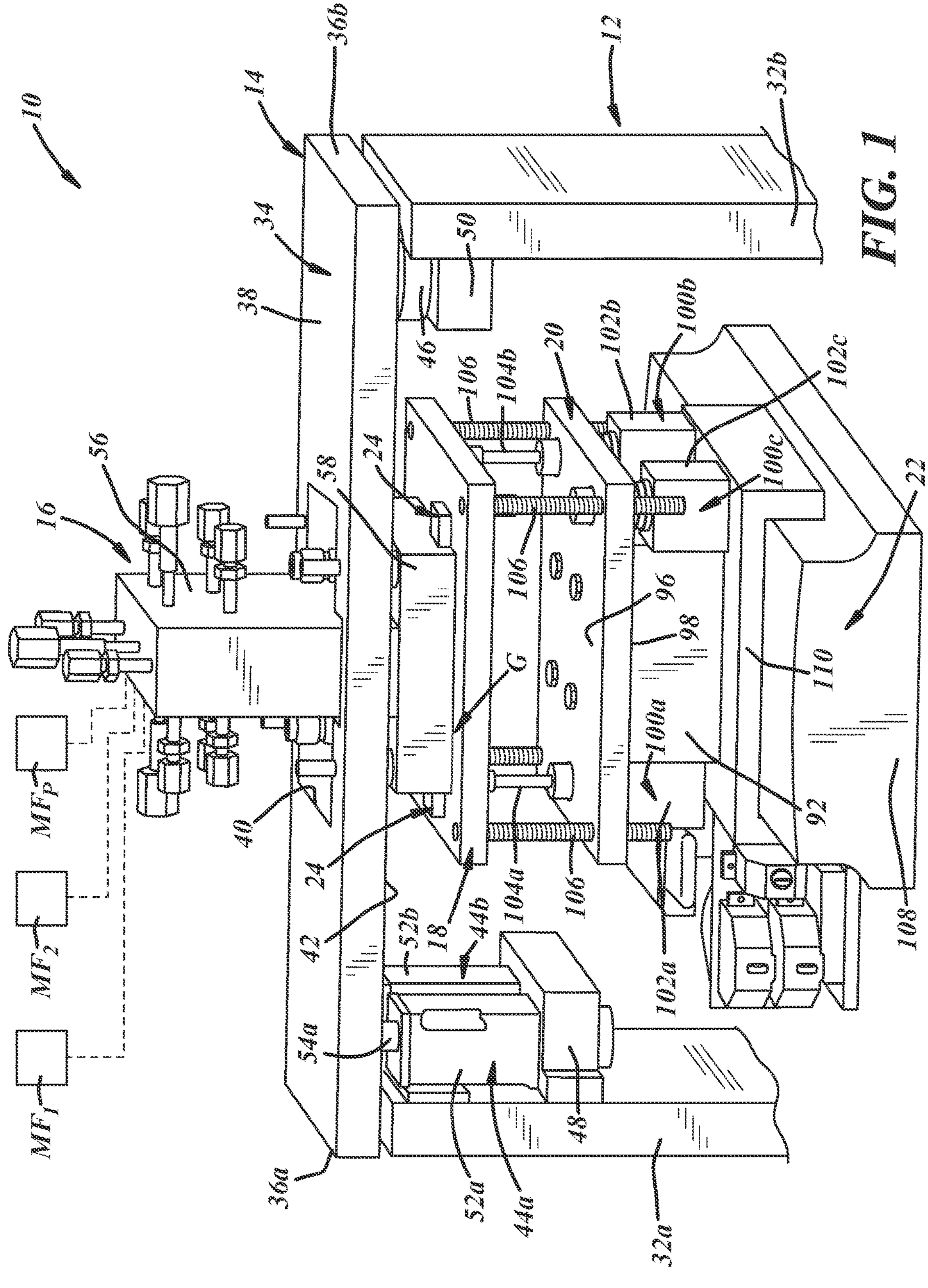
FIG. 1 is a perspective view of a SALD apparatus according to one embodiment of the present disclosure.

The zoned ALD precursor gas distributor 16 includes a gas manifold 56 and a depositor head 58 (FIGS. 4, 6, and 8-9). The gas manifold 56 is fluidly connected above the elongated plate 38 to sources (not shown) of the first ALD precursor gas, the second ALD precursor gas, the inert gas, and a vacuum source to provide suction for the exhaust of unreacted precursor gases and the inert gas. The gas manifold 56 extends through the central opening 40 to a delivery end 60 of the manifold 56. The depositor head 58 is secured to the delivery end 60 of the gas manifold 56 below the elongated plate 38 by fasteners or another type of joint, although in other implementations the gas manifold 56 and the depositor head 58 may be integrally formed. The depositor head 58 may be constructed from stainless steel or some other electrically-conductive and chemically-inert material that does not react adversely with the precursor gases during delivery. Mass flow controllers may be attached to the gas manifold 56 or they may be more remotely located to control the flow of the first and second ALD precursor gases as well as the flow of the inert gas. In FIGS. 1 and 5, the mass flow controller(s) that control the flow of the first ALD precursor gas, the flow of the second ALD precursor gas, and the flow of the inert gas are denoted generally by the reference identifiers $MF_1$, $MF_2$, and $MF_P$.

Figure 6:
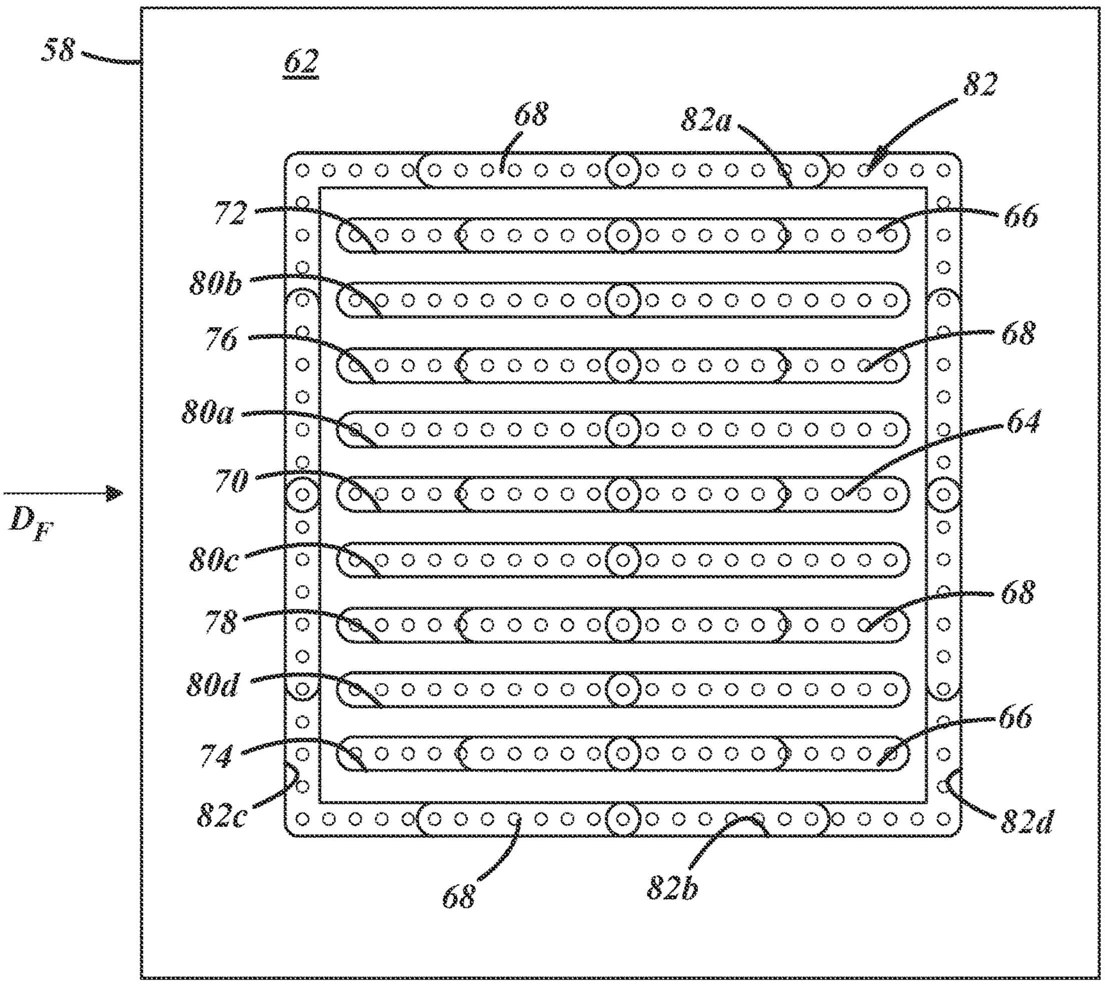
FIG. 6 is plan view of an active surface of a depositor head of the SALD apparatus depicted in FIG. 1 according to one embodiment of the present disclosure.
Figure 8:
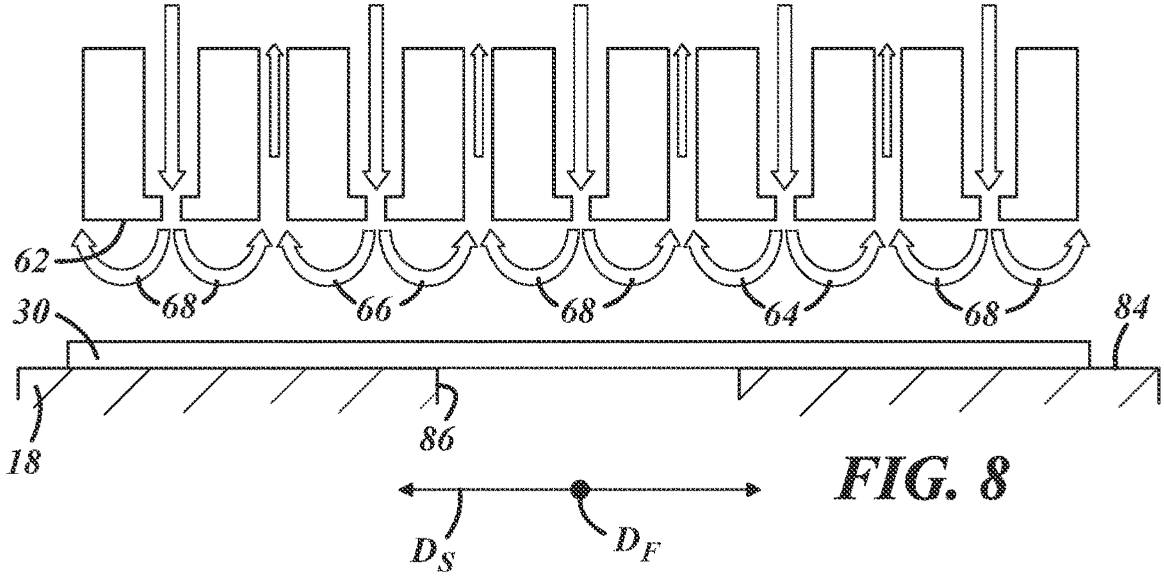
FIG. 8 is side schematic view of a depositor head and an opposed substrate plate of the SALD apparatus depicted in FIG. 1 according to one embodiment of the present disclosure.

The depositor head 58 has an active surface 62 configured to discharge at least one linear flow of the first ALD precursor gas 64, at least one linear flow of the second ALD precursor gas 66, and at least one linear flow of the inert gas 68 that separates the linear flow of the first ALD precursor gas 64 and the linear flow of the second ALD precursor gas 66, as shown in FIGS. 6 and 8. The linear flow of the first ALD precursor gas 64, the linear flow of the second ALD precursor gas 66, and the linear flow of the inert gas 68 are parallel to each other and extend in a first direction $D_F$. Since the linear flows of the ALD precursor gases 64, 66 are separated and flow isolated by the linear flow of the inert gas 68, the linear flow of the first ALD precursor gas 64 and the linear flow of the second ALD precursor gas 66 establish first and second ALD precursor gas zones, respectively, while the linear flow of the inert gas 68 establishes an inert gas curtain. More than one linear flow of the first ALD precursor gas and more than one linear flow of the second ALD precursor gas may be delivered from the active surface 62 of the depositor head 58 so long as the linear flows of the first and second ALD precursor gases alternate across the active surface 62 with each pair of adjacent linear flows of the first and second ALD precursor gases being separated by a linear flow of the inert gas to ensure the establishment of respective ALD precursor gas zones. Each linear flow of the various ALD precursor and inert gas is controlled by its own mass flow controller $MF_1$, $MF_2$, and $MF_P$.

Figure 9:
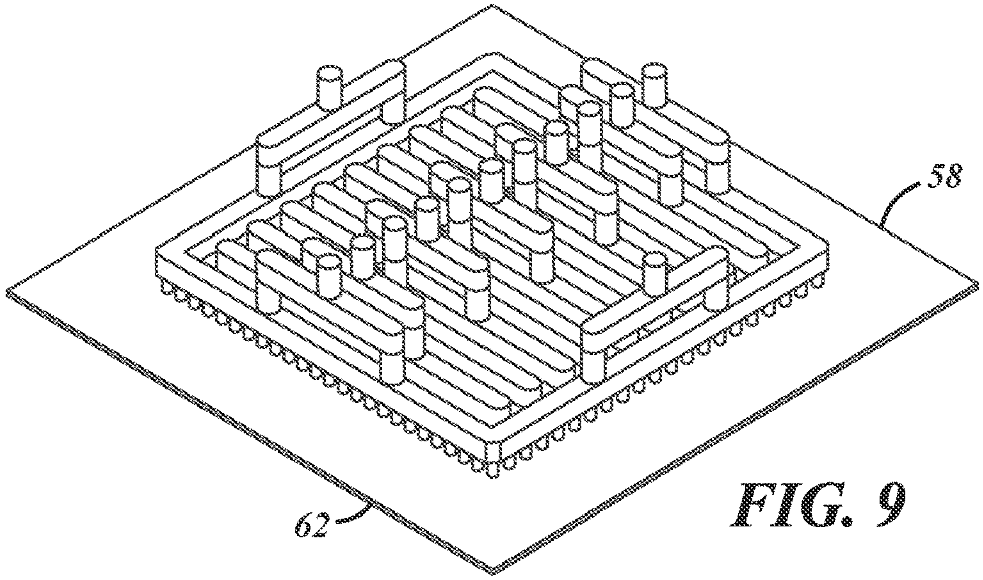
FIG. 9 is perspective view of a depositor head of the SALD apparatus depicted in FIG. 1 according to one embodiment of the present disclosure.

In one specific embodiment, as shown in FIGS. 6 and 8-9 and often referred to as a "showerhead" delivery arrangement, the active surface 62 of the depositor head 58 may define a central elongated channel 70 that discharges a linear flow of the first ALD precursor gas. The active surface 62 also defines a second elongated channel 72 on one side of the central elongated channel 70 and a third elongated channel 74 on the other side of the central elongated channel 70. Each of the second and third elongated channels 72, 74 extends parallel to the central elongated channel 70 and discharges a linear flow of the second ALD precursor gas. And, to keep the linear flows of the first and second ALD precursor gases isolated into their respective ALD precursor gas zones, a fourth elongated channel 76 is defined by the active surface 62 between the central elongated channel 70 and the second elongated channel 72 that discharges a linear flow of the inert gas, and a fifth elongated channel 78 is defined by the active surface 62 between the central elongated channel 70 and the third elongated channel 74 that discharges a linear flow of the inert gas. Each of the fourth and fifth elongated channels 76, 78 extends parallel to each of the central, first, and second elongated channels 70, 72, 74 and is bound on each side by a pair of elongated vacuum ports **80*a*, 80*b*, 80*c*, 80*d*. The vacuum ports 80*a*, 80*b*, 80*c*, 80*d* communicate with exhaust lines to remove the inert gas any un-reacted ALD precursors gases. All of the elongated channels 70, 72, 74, 76, 78** run parallel to each other and extend along the first direction $D_F$.

The active surface 62 of the depositor head 58 also defines a continuous peripheral border channel 82 that surrounds and encloses all of the other channels 70, 72, 74, 76, 78. The peripheral border channel 82 includes first and second elongated side channel portions **82*a*, 82*b* that run parallel to the other elongated channels 70, 72, 74, 76, 78 and, thus, extend in the first direction $D_F$. Additionally, the peripheral border channel 82 includes first and second elongated bridge channel portions 82*c*, 82*d* that run perpendicular to the elongated channels 70, 72, 74, 76, 78 and connect with the elongated side channel portions 82*a*, 82*b* to complete the continuous track of the peripheral border channel 82. The peripheral border channel 82 discharges a flow of the inert gas and, more specifically, the four channel portions 82*a*, 82*b*, 82*c*, 82*d* of the peripheral border channel 82 discharge corresponding linear flows of the inert gas. In that regard, a linear flow of the inert gas is located on each side of the second and third elongated channels 72, 74 opposite the fourth and fifth elongated channels 76, 78, respectively, such that an inert gas curtain is present on each side of the second ALD precursor gas zones established by the linear flows of the second ALD precursor gas discharged from the second and third elongated channels 72, 74**.

Figure 2:
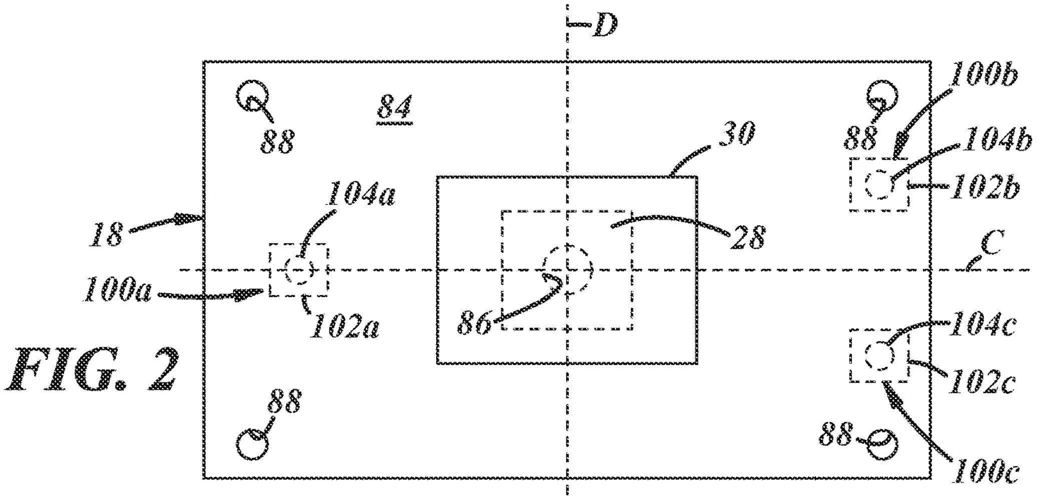
FIG. 2 is plan view of a substrate plate of the SALD apparatus depicted in FIG. 1 according to one embodiment of the present disclosure.

The substrate plate 18 has a first axis C and a second axis D (FIG. 2). The first and second axes C, D of the substrate plate 18 extend centrally through the plate 18 and are perpendicular to each other. The two axes C, D define a plane of the substrate plate 18 that, like the plane of the elongated body 34, lies parallel to the horizontal within an acceptable tolerance in that each axis C, D may deviate from the horizontal by no more than 5°. The substrate plate 18 opposes the depositor head 58 and includes a support surface 84 that retains the build substrate 30. The support surface 84 defines one or more vacuum holes 86 that communicate with a vacuum source through a vacuum chuck to create suction at the support surface 84. This suction retains the build substrate 30 in a defined position on the support surface 84 for conformal SALD thin-film growth. The substrate plate 18 is also heatable and, to that end, may include an electric heater, such as a flexible polyimide heater attached to an exterior of the plate 18, so that the plate 18 can be heated to temperatures of approximately 100° to 400° C., with temperature requirements varying based on the composition of ALD precursor gases and the desired composition and properties of the ALD material film being grown. The substrate plate 18 may be constructed from a nickel-iron alloy such as 64FeNi (Invar). The substrate plate 18 also defines a plurality of locator shaft openings 88 that extend through the plate 18 from the support surface 84 to a back surface 90 of the plate 18 opposite the support surface 84. Preferably, one locator shaft opening 88 is present at each corner of the plate 18.

Figure 7:
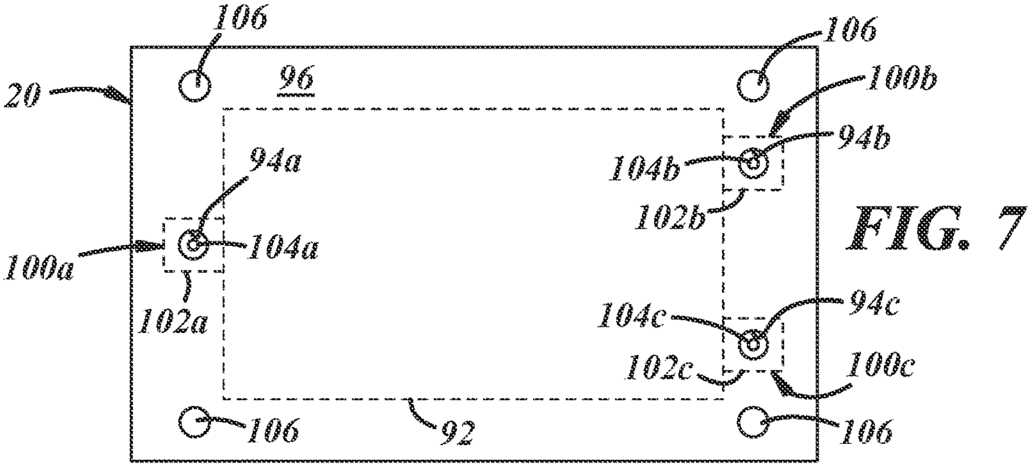
FIG. 7 is a plan view of a base plate of the SALD apparatus depicted in FIG. 1 according to one embodiment of the present disclosure.

The base plate 20 is positioned below the substrate plate 18 and is disposed on a central block 92 that is either integral with the base plate 20 or otherwise secured to the base plate 20 by, for example, one or more fasteners (FIG. 7). The base plate 20 defines first, second, and third openings **94*a*, 94*b*, 94*c* that traverse the base plate 20 from a top surface 96, which faces the back surface 90 of the substrate plate 18, to a bottom surface 98, which faces away from the top surface 96. A third linear actuator 100*a* extends through the first opening 94*a* and, likewise, a fourth linear actuator 100*b* and a fifth linear actuator 100*c* extend through the second and third openings 94*b*, 94*c*, respectively. The linear actuators 100*a*, 100*b*, 100*c* include third, fourth, and fifth motors 102*a*, 102*b*, 102*c* as well as third, fourth, and fifth actuation rods 104*a*, 104*b*, 104*c* that are connected to and driven by their respective motors 102***a*, 102*b*, 102*c*. The motors 102*a*, 102*b*, 102*c* are secured to the central block 92 below the base plate 20. Each of the third, fourth, and fifth actuation rods 104*a*, 104*b*, 104*c*, as well as each of the third, fourth, and fifth motors 102*a*, 102*b*, 102*c*, may be the same as the first and second actuation rods 54*a*, 54*b* and the first and second motors 52*a*, 52*b* described above and, thus, the description of the linear actuators 44*a*, 44*b* and its components as set forth above is equally applicable here. The base plate 20 may also include a plurality of threadably-supported locator shafts 106. Each of the locator shafts 106 is aligned with and receivable through one of the locator shaft openings 88 defined in the substrate plate 18. The locator shafts 106 may be used to achieve initial positioning of the substrate plate 18 relative to the base plate 20, or to maintain the position of the plates 18, 20 when the SALD apparatus 10 is off-line, but are generally not secured to the substrate plate 18 (although they may extend freely through the locator shaft openings 88) with nuts or other threaded engagement devices when the SALD apparatus 10 is operating.

Each of the third, fourth, and fifth actuation rods 104*a*, 104*b*, 104*c* of the third, fourth, and fifth linear actuators 100*a*, 100*b*, 100*c* extends through its respective aligned opening 94*a*, 94*b*, 94*c* in the base plate 20 and engages the back surface 90 of the substrate plate 18. The third, fourth, and fifth linear actuators 100*a*, 100*b*, 100*c* support the substrate plate 18 above the base plate 20 yet below the depositor head 58 such that a gap G exists between the active surface 62 of the depositor head 58 and the support surface 84 of the substrate plate 18. In the embodiment shown, the third actuation rod 104*a* engages the back surface 90 of the substrate plate 18 on the first axis C while the fourth and fifth actuation rods 104*b*, 104*c* are spaced apart along a direction parallel to the second axis D such that the fourth actuation rod 104*b* engages the back surface 90 of the substrate plate 18 on one side of the first axis C and the fifth actuation rod 104*c* engages the back surface 90 on the other side of the first axis C. The third linear actuator 100*a* may be positioned proximate the first and second linear actuators 44*a*, 44*b* that support the first end 36*a* of the elongated body 34 while the fourth and fifth linear actuators 100*b*, 100*c* may be positioned proximate the ball mount 46 that supports the second end 36*b* of the elongated body 34. As such, the points of engagement between the back surface 90 of the substrate plate 18 and the third, fourth, and fifth linear actuators 100*a*, 100*b*, 100*c* form an acute triangle that is oppositely oriented from the acute triangle formed by the engagement points of first and second linear actuators 44*a*, 44*b* and the ball mount 46 with the underside 42 of the elongated plate 38. The controlled linear displacement of the third, fourth, and fifth actuation rods 104*a*, 104*b*, 104*c* of the third, fourth, and fifth linear actuators 100*a*, 100*b*, 100*c*—individually and in coordination with each other—allows the substrate plate 18 to be tilted about each of its axes C, D to achieve precision movement in three-dimensions.

The linear motion stage 22 moves the substrate plate 18 relative to the depositor head 58 to facilitate the SALD process. The linear motion stage 22 includes a travel stand 108 and a mobile table 110 that is slidable fore and aft along the travel stand 108 in a machine dimension. The sliding movement of the mobile table 110 is effectuated by a linear drive motor housed within the travel stand 108. As part of the SALD apparatus 10, the central block 92 upon which the base plate 20 is disposed is mounted to the mobile table 110 by mechanical fasteners. Sliding linear movement of the mobile table 110 thus simultaneously moves the substrate plate 18 in the same direction since the substrate plate 18 is supported by the third, fourth, and fifth linear actuators 100*a*, 100*b*, 100*c* and carried by the base plate 20, as described above. A number of constructions of the linear motion stage 22 are permitted and would work within the construct of the SALD apparatus 10. In general, the linear motion stage 22 preferably has sub-micron resolution, or minimum incremental movement, typically on the order of 5 nm to 10 nm, and a maximum travel speed of 2 meters per second, along with sub-micron repeatability and sub-10-micron horizontal and vertical straightness. One specific and commercially available linear motion stage that satisfies these performance characteristics is an Aerotech Pro 165 LM mechanical bearing linear motor stage.

The gap detection sensors 24 number at least three and are attached to either the depositor head 58 or the substrate plate 18 and are configured to measure the size of the gap G—i.e., the distance between the active surface 62 of the depositor head 58 and the support surface 84 of the substrate plate 18—at each sensor location (FIGS. 1-2). Each of the three gap detection sensors 24 is preferably attached to a separate side of the depositor head 56 or plate 18 and is aligned planarly with the active or support surface 62, 84 so that an accurate reading of the gap G can be realized. At least three gap detection sensors 24 are employed since a minimum of three points are needed to define a plane, and, accordingly, with three gap detection sensors 24, a parallel plane alignment algorithm can be implemented to measure and adjust the size and uniformity of the gap G across the active and support surfaces 62, 84 of the depositor head 58 and the substrate plate 18, as will be further explained below. Each of the gap detection sensors 24 is able to measure a distance between opposed surfaces of in the range of 25 μm to 1250 μm, particularly since a target value of the gap G often ranges from 50 μm to 1000 μm. With these specifications in mind, each of the gap detection sensors 24 is a proximity sensor such as, for instance, a capacitive sensor, a photoelectric sensor, an inductive sensor, or a laser sensor.

Capacitive sensors measure the capacitance between two electrically conductive surfaces that are close to each other. Here, one of the depositor head 58 or the substrate plate 18 is connected to a high-impedance amplifier, and the other of the depositor head 58 or the substrate plate 18 is connected to ground. The amplifier, which can supply an amplified voltage of up to 2 kV, is activated to excite the depositor head 58 or the substrate plate 18, whichever component it is connected to, thus creating a capacitance between the sensor and the opposed active or support surface 62, 84. This capacitance is sensitive to the distance between the sensor and the opposed surface and is measured by the capacitive sensor. The capacitive sensor outputs an output signal, typically an output voltage, that is scaled to represent the size of the gap G at that particular sensor location. The output signal from each of the capacitive sensors is delivered to a data acquisition device that collects and amplifies the output signals for subsequent data processing. Any of a wide variety of capacitive sensors may be used for this application including, in particular, Capacitec HPB-75 capacitive button probes and conjunction with a high-impedance 200-series modular amplifier.

The controller 26 is connected to and interfaces with the gap detection sensors 24, through the data acquisition device, as well the amplifier and the first through fifth motors 52*a*, 52*b*, 102*a*, 102*b*, 102*c* that drive the first through fifth actuation rods 54*a*, 54*b*, 104*a*, 104*b*, 104*c*. The linear motion stage 22 and the mass flow controllers $MF_1$, $MF_2$, $MF_P$ that control gas flow through the zoned ALD precursor gas distributor 16 may also be connected to and interface with the controller 26. The controller 26 may be a computer terminal that is dedicated to operating the SALD apparatus 10 or some other programmable device that can receive input data, execute programmed instructions, and export output data. A programming language, such as Python, may be used to establish an integrated application program interface through which all of the components connected to the controller 26 can be communicated with and controlled through appropriate communication protocols. The Python programming language is a good candidate because it allows for a user interface, parallel processing with multi-threading, and can communicate with all of the applicable hardware devices in the SALD apparatus 10. A diagrammatic depiction of how the various components of the SALD apparatus 10 may connect with the controller 26 is shown in FIG. 5.

The SALD apparatus 10 can be operated to grow a precision film of the ALD material layer-by-layer onto the growth portion 28 of the build substrate 30 while monitoring and, if necessary, adjusting a spatial orientation of the depositor head 58 and the substrate plate 18 in real-time. The spatial orientation of the depositor head 58 and the substrate plate 18 that is monitored and possibly adjusted may be the size of the gap G between the active surface 62 of the depositor head 58 and the support surface 84 of the substrate plate 18 and/or the parallelism of those two surfaces 62, 84. For example, when conducting SALD, it may be desired to maintain the gap G between the active and support surfaces 62, 84 of the depositor head 58 and the substrate plate 18, respectively, at a target value ranging anywhere from 50 μm to 1000 μm, or more narrowly from 50 μm to 500 μm, while maintaining parallelism between the active and support surfaces 62, 84. The term "parallelism" refers to a parallel orientation between the active and support surfaces 62, 84 of the depositor head 58 and the substrate plate 18, respectively, or, in other words, a constant distance between the two surfaces 62, 84 across the entire gap G, within a tolerance of ±10 μm.

To operate the SALD apparatus, the linear flow(s) of the first ALD precursor gas 64, the linear flow(s) of the second precursor ALD gas 66, and the linear flow(s) of the inert gas 68 are discharged from the active surface 62 of the depositor head 58 to establish the precursor ALD gas zone(s) and the inert gas curtain(s). The discharge of these linear gas flows is controlled by the controller 26 through the mass flow controllers $MF_1$, $MF_2$, $MF_P$. All of the first ALD precursor gas zone(s), the second ALD precursor gas zone(s), and the inert gas curtain(s) that separate and isolate the first and second ALD precursor gas zones extend along the first direction $D_F$ as described above. At the same time, the linear motion stage 22 causes the substrate plate 18 to move back-and-forth relative to the depositor head 58 in a second direction $D_S$ (FIG. 8) that is perpendicular to the first direction $D_F$ along which the first and second ALD precursor gas zones extend. The linear motion stage 22 invokes this movement by reciprocally sliding the mobile table 110 back-and-forth along the travel stand 108. The reciprocal sliding movement of the mobile table 110 is translated into corresponding movement of the substrate plate 18 by way of the base plate 20. In the embodiment shown in FIG. 1, the back-and-forth movement of the substrate plate 18 along the second direction $D_S$ would transpire parallel to the second axis D of the substrate plate 18 and perpendicular to the longitudinal axis A of the elongated body 34.

The relative linear movement between the substrate plate 18 and the depositor head 58 alternately exposes the growth portion 28 of the build substrate 30 to the first and second ALD precursor gases to deposit the ALD material film one atomic monolayer at a time. The constant relative movement between the substrate plate 18 and the depositor head 58 when conducting SALD on one build substrate 30 or a number of different build substrates 30 may, at some point, result in a spatial deviation or misalignment between the two components 18, 58, which can render the gap G between the opposed active and support surfaces 62, 84 too large and/or too non-uniform to support the first and second ALD precursor gas zones. To that end, the gap detection sensors 24 allow the size and parallelism of the gap G to be monitored over time. Each gap detection sensor 24 detects the size of the gap G—that is, the distance between the active surface 62 of the depositor head 58 and the support surface 84 of the substrate plate 18 at its particular sensor location—and reports that distance to the controller 26 in real-time through the generated output signal it delivers to the controller 26. The controller 26 uses the reported distance data embedded in the output signals received from the gap detection sensors 24 to determine whether parallelism exists between the active and support surfaces 62, 84.

Based on that data received from the gap detection sensors 24, the controller 26 can adjust the size and/or uniformity of the gap G by commanding one or more of the first through fifth motors 52*a*, 52*b*, 102*a*, 102*b*, 102*c* to linearly displace, either positively or negatively, one or more of their respective actuation rods 54*a*, 54*b*, 104*a*, 104*b*, 104*c*. The controller 26 can command the motors 52*a*, 52*b*, 102*a*, 102*b*, 102*c* to linearly actuate their respective actuation rods 54*a*, 54*b*, 104*a*, 104*b*, 104*c* by a certain calculated distance through a positioning signal that is sent from the controller 26 to each of the motors 52*a*, 52*b*, 102*a*, 102*b*, 102*c*. In that regard, the controller 26 can (1) actuate the first and/or second actuation rods 54*a*, 54*b* to tilt the elongated body 34 about either or both of its axes A, B, which in turn causes the depositor head 58 to tilt in a corresponding fashion, can (2) actuate the third, fourth, and/or fifth actuation rods 104*a*, 104*b*, 104*c* to tilt the substrate plate 18 about either or both of its axes C, D, or (3) can cause both forms of tilting at the same time to correct the size and/or uniformity of the gap G. For example, upon receiving the output signals from the gap detection sensors 24 and determining that an adjustment in the gap G between the active surface 62 of the depositor head 58 and the support surface 84 of the substrate plate 18 is needed, the controller 26 can execute a parallel plane alignment algorithm to determine how much linear actuation is needed from each of the first through fifth actuation rods 54*a*, 54*b*, 104*a*, 104*b*, 104*c* to bring the size and/or uniformity of the gap G back into conformity, and can command the appropriate linear movement of the actuation rods 54*a*, 54*b*, 104*a*, 104*b*, 104*c* through actuator-specific positioning signals.

In one type of parallel plane alignment algorithm that focuses on actuating the third, fourth, and fifth actuation rods 104*a*, 104*b*, 104*c* to bring about parallelism between the active and support surfaces 62, 84, parallel plane geometry may be used to solve for a distance Δz that each of the actuation rods 104*a*, 104*b*, 104*c* must be moved to achieve parallelism. Given the three data sets contained in the output signals produced by the three gap detection sensors 24, a plane equation that represents a parallel state between the active surface 62 and the support surface 84 can be obtained by solving the following system of equations, in which $x_1$, $x_2$, $x_3$, $y_1$, $y_2$, $y_3$, $z_1$, $z_2$, $z_3$ are points for the sensors 24 in an x-y-z coordinate system established for the calculation, and d is the target distance between the active and support surfaces 62, 84 at each sensor location:

Sensor 1: $ax_1+by_1+cz_1+d=0$

Sensor 2: $ax_2+by_2+cz_2+d=0$

Sensor 3: $ax_3+by_3+cz_3+d=0$

The Sensor 1, Sensor 2, and Sensor 3 equations above essentially dictate that the gap distance "d" measured by each of the gap detection sensors 24 is the same. The Sensor equations can be solved using basic matrix manipulations and Cramer's rule, in which D is a non-zero for planes not through the origin, such that a, b, and c can be calculated as follows:

$$D = \begin{bmatrix} x_1 & y_1 & z_1 \\ x_2 & y_2 & z_2 \\ x_3 & y_3 & z_3 \end{bmatrix}$$

$$a = \frac{-d}{D}\begin{bmatrix} 1 & y_1 & z_1 \\ 1 & y_2 & z_2 \\ 1 & y_3 & z_3 \end{bmatrix}$$

$$b = \frac{-d}{D}\begin{bmatrix} x_1 & 1 & z_1 \\ x_2 & 1 & z_2 \\ x_3 & 1 & z_3 \end{bmatrix}$$

$$c = \frac{-d}{D}\begin{bmatrix} x_1 & y_1 & 1 \\ x_2 & y_2 & 1 \\ x_3 & y_3 & 1 \end{bmatrix}$$

Once a, b, and c are calculated, the plane equation is set, and the Δz distance that each actuation rod 104*a*, 104*b*, 104*c* must be moved to equalize the measured gap distance reported by each sensor and to therefore achieve parallelism between the active and support surfaces 62, 84 can be calculated as follows:

$$\Delta z_1 = d + \frac{d + ax_1 + by_1}{c}$$

$$\Delta z_2 = d + \frac{d + ax_2 + by_2}{c}$$

$$\Delta z_3 = d + \frac{d + ax_3 + by_3}{c}$$

Once the Δz distances are determined for each of the actuation rods 104*a*, 104*b*, 104*c*, the controller 26 can command each of the third through fifth motors 102*a*, 102*b*, 102*c* to move their respective actuation rods 104*a*, 104*b*, 104*c* the calculated distance Δz through positioning signals. The process can be repeated multiple times, if necessary, to iteratively improve the accuracy of the calculations and to ultimately achieve the desired gap size and uniformity characteristics. Of course, the controller 26 and gap detection sensors 24 are continually monitoring the gap G between the active and support surfaces 62, 84 and reporting data to the controller 26, which, in turn, can execute the parallel plane alignment algorithm and continuously instruct movement of any or all of the actuation rods 54*a*, 54*b*, 104*a*, 104*b*, 104*c* of the linear actuators 44*a*, 44*b*, 100*a*, 100*b*, 100*c* at any time. Furthermore, a Python-based user interface (UI) can record and display live data for the size and uniformity of the gap G. Accordingly, the size of the gap G and the uniformity of the gap G can be confidently preserved over time to ensure the SALD process is not disrupted on account of suboptimal spacing between the depositor head 58 and the substrate plate 18.

It is to be understood that the foregoing description is of one or more preferred example embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A spatial atomic layer deposition apparatus comprising:

a depositor head having an active surface configured to discharge a flow of a first precursor gas, a flow of a second precursor gas, and a flow of an inert gas that separates the flow of the first precursor gas and the flow of the second precursor gas;

a substrate plate that opposes the depositor head, the substrate plate having a support surface that retains a build substrate, the support surface of the substrate plate being spaced apart from the active surface of the depositor head by a gap;

a linear motion stage that reciprocally moves the substrate plate relative to the depositor head;

a plurality of gap detection sensors supported on either the depositor head or the substrate plate, each of the gap detection sensors producing an output signal indicative of a distance between the active surface of the depositor head and the support surface of the substrate plate; and a controller that communicates with the gap detection sensors and receives the output signal from each of the gap detection sensors, wherein the controller is configured to determine a spatial orientation of the active surface of the depositor head and the support surface of the substrate plate based on the output signals received from the gap detection sensors.

2. The spatial atomic layer deposition apparatus set forth in claim 1, further comprising:

a plurality of linear actuators supporting the substrate plate, the plurality of linear actuators being configured to move the substrate plate to adjust the spatial orientation of the active surface of the depositor head and the support surface of the substrate plate.

3. The spatial atomic layer deposition apparatus set forth in claim 2, wherein each of the plurality of linear actuators comprises a motor and an actuation rod connected to and driven by the motor, the motor of each of the plurality of linear actuators being configured to drive linear displacement of its associated actuation rod.

4. The spatial atomic layer deposition apparatus set forth in claim 3, wherein the controller communicates with the motor of each of the plurality of linear actuators and is configured to send a positioning signal to each of the plurality of linear actuators that commands the motor of the linear actuator to linearly displace its associated actuation rod.

5. The spatial atomic layer deposition apparatus set forth in claim 4, wherein the controller is configured to send the positioning signal to each of the plurality of motors to instruct the motor to actuate its corresponding actuation rod a defined distance to move the substrate plate and adjust the spatial orientation of the active surface of the depositor head and the support surface of the substrate plate.

6. The spatial atomic layer deposition apparatus set forth in claim 1, wherein the spatial atomic layer deposition apparatus further comprises a bridge supported in an elevated position above the substrate plate and having an elongated body that is tiltable about both a longitudinal axis and a lateral axis of the body, and wherein the spatial atomic layer deposition apparatus further comprises an ALD precursor gas distributor that is carried on the elongated bridge, the ALD precursor gas distributor comprising the depositor head and a gas manifold that supplies the depositor head with the flow of a first precursor gas, the flow of a second precursor gas, and the flow of an inert gas.

7. The spatial atomic layer deposition apparatus set forth in claim 1, wherein the spatial orientation comprises parallelism of the substrate plate relative to the depositor head.

8. The spatial atomic layer deposition apparatus set forth in claim 1, wherein each of the gap detection sensors is a capacitive sensor.

9. The spatial atomic layer deposition apparatus set forth in claim 1, further comprising:

a bridge supported in an elevated position and having an elongated body that is tiltable about both a longitudinal axis and a lateral axis of the body;

an ALD precursor gas distributor carried by the elongated body, the ALD precursor gas distributor comprising the depositor head; and a plurality of linear actuators that engage a back surface of the substrate plate opposite the support surface, wherein the controller that receives the output signal from each of the gap detection sensors sends a positioning signal to each of the plurality of linear actuators, the controller being configured to adjust the size or the uniformity of the gap between the support surface of the substrate plate and the active surface of the depositor head by actuating, via the positioning signals, one or more of the plurality of linear actuators.

10. The spatial atomic layer deposition apparatus set forth in claim 9, wherein each of the plurality of linear actuators comprises a motor and an actuation rod connected to and driven by the motor, the motor of each of the plurality of linear actuators being configured to drive linear displacement of its associated actuation rod.

11. The spatial atomic layer deposition apparatus set forth in claim 10, wherein the controller is configured to send the positioning signal to each of the plurality of linear actuators to command the motor of the linear actuator to linearly displace its associated actuation rod a defined distance to move the substrate plate and adjust the size or the uniformity of the gap between the support surface of the substrate plate and the active surface of the depositor head.

12. The spatial atomic layer deposition apparatus set forth in claim 9, wherein each of the plurality of gap detection sensors is a capacitive sensor.

13. The spatial atomic layer deposition apparatus set forth in claim 9, wherein the spatial orientation comprises parallelism of the substrate plate relative to the depositor head.

14. The spatial atomic layer deposition apparatus set forth in claim 1, wherein the apparatus is configured to be operated to grow a film of atomic layer deposition material onto a growth portion of the build substrate while monitoring and adjusting the parallelism of the active surface of the depositor head and the support surface of the substrate plate.

15. A spatial atomic layer deposition apparatus comprising:

a depositor head having an active surface configured to discharge a flow of a first precursor gas, a flow of a second precursor gas, and a flow of an inert gas that separates the flow of the first precursor gas and the flow of the second precursor gas;

a substrate plate that opposes the depositor head, the substrate plate having a support surface that retains a build substrate, the support surface of the substrate plate being spaced apart from the active surface of the depositor head by a gap;

a linear motion stage that reciprocally moves the substrate plate relative to the depositor head; and a plurality of gap detection sensors supported on either the depositor head or the substrate plate, each of the gap detection sensors producing an output signal indicative of a distance between the active surface of the depositor head and the support surface of the substrate plate, wherein the apparatus is configured to be operated to grow a film of atomic layer deposition material onto a growth portion of the build substrate while monitoring and adjusting a spatial orientation of the active surface of the depositor head and the support surface of the substrate plate.

16. The spatial atomic layer deposition apparatus set forth in claim 15, further comprising a controller that communicates with the plurality of gap detection sensors and receives the output signal from each of the plurality of gap detection sensors, wherein the controller is configured to determine the spatial orientation of the active surface of the depositor head and the support surface of the substrate plate in real-time while the apparatus is being operated to grow the film.

17. The spatial atomic layer deposition apparatus set forth in claim 16, wherein the controller is configured to send a positioning signal to each of a plurality of actuators to tilt at least one of the depositor head or the substrate plate to adjust the spatial orientation of the active surface of the depositor head and the support surface of the substrate plate in real-time while the apparatus is being operated to grow the film.

18. The spatial atomic layer deposition apparatus set forth in claim 15, wherein the apparatus is configured to monitor and adjust parallelism of the active surface of the depositor head and the support surface of the substrate plate in real-time while the apparatus is being operated to grow the film.

19. A method of operating the spatial atomic layer deposition apparatus set forth in claim 1, the method comprising:

supplying the first precursor gas, the second precursor gas, and the inert gas to the depositor head;

discharging at least one linear flow of the first precursor gas, at least one linear flow of the second precursor gas, and at least one linear flow of the inert gas from the active surface of the depositor head, the at least one linear flow of the inert gas separating the at least one linear flow of the first precursor gas and the at least one linear flow of the second precursor gas;

moving the substrate plate to deposit one or more atomic layers of an ALD material film, each atomic layer of the ALD material film being deposited by sequentially exposing the build substrate to the linear flow of the first precursor gas and the linear flow of the second precursor gas as a result of relative movement between the substrate plate and the depositor head, wherein the first and the second precursor gases react to form the atomic layers of the ALD material film; and during the step of moving, measuring a spatial orientation of the active surface of the depositor head and the support surface of the substrate plate using the gap detection sensors.

* * * * *